(12) United States Patent
Wang et al.

(10) Patent No.: US 9,953,561 B2
(45) Date of Patent: Apr. 24, 2018

(54) ARRAY SUBSTRATE OF DISPLAY APPARATUS AND DRIVING METHOD THEREOF AND DISPLAY APPARATUS

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Hui Wang, Beijing (CN); Hengzhen Liang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 14/787,093

(22) PCT Filed: Mar. 20, 2015

(86) PCT No.: PCT/CN2015/074659
§ 371 (c)(1),
(2) Date: Oct. 26, 2015

(87) PCT Pub. No.: WO2016/078270
PCT Pub. Date: May 26, 2016

(65) Prior Publication Data
US 2016/0343291 A1 Nov. 24, 2016

(30) Foreign Application Priority Data
Nov. 18, 2014 (CN) .......................... 2014 1 0658924

(51) Int. Cl.
*G09G 5/00* (2006.01)
*G09G 3/20* (2006.01)
*H01L 27/12* (2006.01)

(52) U.S. Cl.
CPC ............. *G09G 3/2096* (2013.01); *G09G 3/20* (2013.01); *H01L 27/124* (2013.01);
(Continued)

(58) Field of Classification Search
CPC ..... G09G 3/20; G09G 3/32096; H01L 27/124
(Continued)

(56) References Cited

U.S. PATENT DOCUMENTS 5,939,833 A 8/1999 Song et al.
6,104,370 A * 8/2000 Nakagaki ............. G09G 3/3648
345/100
(Continued)

FOREIGN PATENT DOCUMENTS

CN 1333529 A 1/2002
CN 1363921 A 8/2002
(Continued)

OTHER PUBLICATIONS

First Chinese Office Action dated Jun. 28, 2018; Appln. No. 201410658924.0.
(Continued)

*Primary Examiner* — Adam J Snyder
(74) *Attorney, Agent, or Firm* — Ladas & Parry LLP

(57) ABSTRACT

There are provided an array substrate and a driving method thereof, and a display apparatus. Multiple gate lines are arranged on the array substrate, two ends of the gate lines are connected to a first gate driving circuit and a second gate driving circuit respectively, each of the gate lines is divided into a first gate line portion connected to the first gate driving circuit and a second gate line portion connected to the
(Continued)

second gate driving circuit, and a switch element is arranged between the first gate line portion and the second gate line portion. Simultaneous turning-on of display TFTs controlled by one gate line is avoided, and the pulling to the voltage of a common electrode is reduced.

19 Claims, 1 Drawing Sheet

(52) U.S. Cl.
CPC . *G09G 2300/0408* (2013.01); *G09G 2300/08* (2013.01); *G09G 2310/0213* (2013.01); *G09G 2310/0267* (2013.01); *G09G 2310/08* (2013.01); *G09G 2320/0209* (2013.01); *G09G 2320/0257* (2013.01); *G09G 2330/026* (2013.01); *G09G 2380/02* (2013.01)

(58) Field of Classification Search
USPC .......................................................... 345/1.3
See application file for complete search history.

(56) References Cited

U.S. PATENT DOCUMENTS

| | | | | |
|---|---|---|---|---|
| 2002/0044127 A1* | 4/2002 | Uchino | ................ | G09G 3/3666 345/98 |
| 2002/0054036 A1* | 5/2002 | Johnson | ............... | G09G 3/3648 345/204 |
| 2002/0084965 A1* | 7/2002 | Park | .................... | G09G 3/3666 345/87 |
| 2005/0156920 A1* | 7/2005 | Tanaka | ................ | G09G 3/3666 345/204 |
| 2005/0231494 A1* | 10/2005 | Kumada | .............. | G09G 3/3666 345/204 |
| 2006/0274021 A1* | 12/2006 | Park | ........................ | G09G 3/20 345/100 |
| 2008/0074567 A1* | 3/2008 | Jeon | ..................... | G09G 3/3666 349/33 |
| 2008/0100601 A1 | 5/2008 | Moon et al. | | |
| 2008/0123026 A1 | 5/2008 | Kwag et al. | | |
| 2008/0165110 A1 | 7/2008 | Kim et al. | | |
| 2008/0198283 A1 | 8/2008 | Yoon et al. | | |
| 2009/0284500 A1* | 11/2009 | Yamashita | ........... | G09G 3/3666 345/92 |
| 2010/0033472 A1 | 2/2010 | Choi | | |
| 2011/0148825 A1* | 6/2011 | Ueno | ................... | G09G 3/3677 345/204 |
| 2011/0150169 A1 | 6/2011 | Lin et al. | | |
| 2013/0271661 A1* | 10/2013 | Kimura | ................ | G09G 3/3674 348/564 |
| 2014/0160111 A1 | 6/2014 | Zhang et al. | | |
| 2015/0325564 A1 | 11/2015 | Chen | | |
| 2015/0379936 A1* | 12/2015 | Lim | ..................... | G09G 3/3266 345/204 |

FOREIGN PATENT DOCUMENTS

| | | |
|---|---|---|
| CN | 1877688 A | 12/2006 |
| CN | 101196665 A | 6/2008 |
| CN | 101217024 A | 7/2008 |
| CN | 101251692 A | 8/2008 |
| CN | 102981339 A | 3/2013 |
| CN | 104064569 A | 9/2014 |
| CN | 104318890 A | 1/2015 |

OTHER PUBLICATIONS

International Search Report and Written Opinion both dated Jul. 28, 2015; PCT/CN2015/074659.
Second Chinese Office Action dated Jan. 12, 2017; Appln. No. 201410658924.0.
The Fourth Chinese Office Action dated Dec. 12, 2017; Appln. No. 201410658924.0.

* cited by examiner

ARRAY SUBSTRATE OF DISPLAY APPARATUS AND DRIVING METHOD THEREOF AND DISPLAY APPARATUS

TECHNICAL FIELD OF THE DISCLOSURE

The present disclosure relates to an array substrate and a driving method thereof, and a display apparatus.

BACKGROUND

Gate lines and data lines which are crossing each other are arranged on an array substrate of a display apparatus. The gate lines and the data lines embrace pixels within which display thin film transistors (TFTs) and pixel electrodes are arranged. One gate line controls the turning on of one row of display TFTs so as to determine whether the data line charges the pixel electrodes of the row of pixels. Therefore, in order to drive the display apparatus, gate driving circuits and source driving circuits should be arranged on the array substrate, wherein the gate driving circuit output a gate driving signal to the gate lines, and the source driving circuit outputs a data signal to the data lines.

Currently, display apparatuses are developing in the direction of large size and high definition, and one gate line needs to control more and more display TFTs. In order to avoid the insufficiency of the turning-on voltage for the display TFTs far away from the gate driving circuit, a display apparatus usually comprises two gate driving circuits located at the two ends of the gate lines respectively. The two gate driving circuits output the same gate driving signal to one gate line from two sides simultaneously, so as to ensure normal turning-on of all display TFTs controlled by the gate line.

SUMMARY

At least one embodiment of the present disclosure provides an array substrate and a driving method thereof, and a display apparatus, which can avoid simultaneous turning-on of display TFTs controlled by the same gate line to reduce the pulling to the voltage of a common electrode.

At least one embodiment of the present disclosure provides an array substrate on which multiple gate lines are arranged, wherein two ends of the gate lines are connected to a first gate driving circuit and a second gate driving circuit respectively, each of the gate lines is divided into a first gate line portion connected to the first gate driving circuit and a second gate line portion connected to the second gate driving circuit, and a switch element is arranged between the first gate line portion and the second gate line portion.

The switch element is a thin film transistor (TFT).

A source of the TFT is connected to the first gate line portion, a drain of the TFT is connected to the second gate line portion, a gate of the TFT is connected to a signal input terminal, and the signal input terminal inputs a turning-on signal or a turning-off signal to control the turning on or turning off of the TFT.

The array substrate further comprises a display TFT located within a pixel, the turning-on signal and the turning-off signal of the TFT are the same as a turning-on signal and a turning-off signal of the display TFT.

The signal input terminal is connected to an integrated circuit board through a flexible circuit board.

The number of pixels driven by the first gate line portion is the same as or different from the number of pixels driven by the second gate line portion.

The first gate driving circuit and the second driving circuit are located on the array substrate.

The first gate driving circuit and the second gate driving circuit each comprises at least two portions, each portion of the first gate driving circuit drives at least one of the first gate line portions respectively, and each portion of the second gate driving circuit drives at least one of the second gate line portions respectively.

An embodiment of the present disclosure provides an array substrate on which multiple gate lines are arranged, wherein each of the gate lines is divided into a first gate line portion connected to a first gate driving circuit and a second gate line portion connected to a second gate driving circuit, and a switch element is arranged between the first gate line portion and the second gate line portion. When the switch element is turned off, it is possible to avoid simultaneous turning-on of the display TFTs controlled by the first gate line portion and the display TFTs controlled by the second gate line portion, so as to avoid simultaneous charging for one row of pixel electrodes. Therefore, the pulling to the voltage of a common electrode is reduced, which can then reduce the effect on the actual voltage applied on the pixels and alleviate defects such as afterimage and crosstalk appearing in the display apparatus.

In addition, at least one embodiment of the present disclosure further provides a display apparatus comprising the above described array substrate.

At least one embodiment of the present disclosure further provides a driving method for driving the array substrate, comprising:

controlling the switch element to turn off the switch element;

the first gate driving circuit outputting a gate driving signal to the first gate line portion; and the second gate driving circuit outputting a gate driving signal to the second gate line portion, wherein after the gate driving signal outputted by the first gate driving circuit lasts for a time period, the second gate driving circuit outputs the gate driving signal.

A scan time of one of the gate lines is T, and after the gate driving signal outputted by the first gate driving circuit lasts for 0.4T~0.5T, the second gate driving circuit outputs the gate driving signal.

An embodiment of the present disclosure provides a driving method for driving the array substrate, comprising: controlling the switch element to turn off the switch element; the first gate driving circuit outputting a gate driving signal to the first gate line portion; and the second gate driving circuit outputting a gate driving signal to the second gate line portion, wherein after the gate driving signal outputted by the first gate driving circuit lasts for a time period, the second gate driving circuit outputs the gate driving signal. Since the second gate driving circuit outputs the gate driving signal after the gate driving signal outputted by the first gate driving circuit lasts for a time period, the display TFTs controlled by the first gate line portion are turned on before the turning on of the display TFTs controlled by the second gate line, avoiding simultaneous turning-on of the display TFTs controlled by the first gate line portion and the display TFTs controlled by the second gate line portion and avoiding simultaneous charging for one row of pixel electrodes. Therefore, the pulling to the voltage of a common electrode is reduced, which can then reduce the effect on the actual voltage applied on the pixels and alleviate defects such as afterimage and crosstalk appearing in the display apparatus.

DETAILED DESCRIPTION

In the following, technical solutions in embodiments of the present disclosure will be clearly and completely described in connection with the drawings. Obviously, the described embodiments are only part of the embodiments of the present disclosure, rather than all the embodiments. Based on the embodiments in the present disclosure, all other embodiments obtained by those skilled in the art without creative work all belong to the protection scope of the present disclosure.

The inventors have found that, for a display apparatus of large size and high definition, the gate lines, the data lines and the common electrode line among others have relatively large resistance, and the coupling capacitances between the gate lines and the common electrode and between the data lines and the common electrode are relatively large. When two gate driving circuits drive one gate line simultaneously, one row of display TFTs are turned on simultaneously, and one row of pixel electrodes are charged simultaneously, which will pull the voltage of the common electrode to a large extent, and then affect the actual voltage applied on the pixels. Therefore, defects such as afterimage and crosstalk can easily appear.

First Embodiment

An embodiment of the present disclosure provides an array substrate that can avoid simultaneous turning-on of display TFTs controlled by one gate line to reduce the pulling to the voltage of the common electrode.

Figure 1:
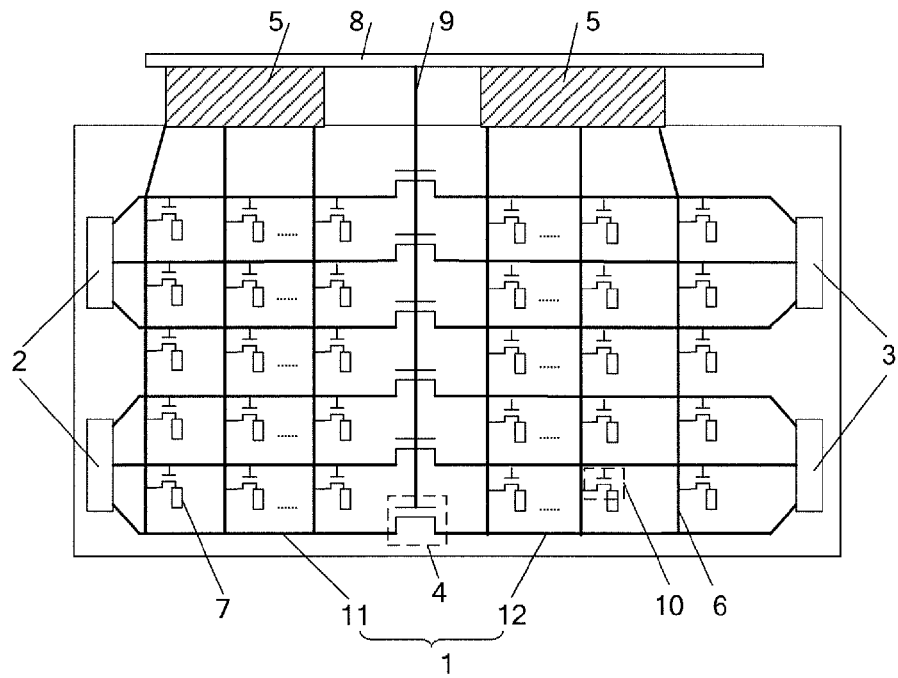
FIG. 1 is a schematic diagram of an array substrate in an embodiment of the present disclosure.

FIG. 1 is a schematic diagram of an array substrate in an embodiment of the present disclosure. As shown in FIG. 1, multiple gate lines 1 are arranged on the array substrate, two ends of the gate lines 1 are connected to a first gate driving circuit 2 and a second gate driving circuit 3 respectively, each of the gate lines 1 is divided into a first gate line portion 11 connected to the first gate driving circuit 2 and a second gate line portion 12 connected to the second gate driving circuit 3, and a switch element 4 is arranged between the first gate line portion 11 and the second gate line portion 12.

When the switch element 4 is turned off and the first gate driving circuit 2 drives the first gate line portion 11, the first gate driving circuit 2 outputs a gate driving signal to the first gate line portion 11, so that the display TFTs 10 controlled by the first gate line portion 11 are turned on, data signals outputted by a source driving circuit 5 to date lines 6 are transferred to pixel electrodes 7 through the display TFTs 10, so as to charge the pixel electrodes 7 connected to the display TFTs 10 controlled by the first gate line portion 11. Since the switch element 4 connected between the first gate line portion 11 and the second gate line portion 12 is turned off, the gate driving signal outputted by the first gate driving circuit 2 will not affect the display TFTs 10 controlled by the second gate line portion 12. Similarly, the gate driving signal outputted by the second gate driving circuit 3 will not affect the display TFTs 10 controlled by the first gate portion 11. Therefore, it is possible to drive the first gate line portion 11 (or the second gate line portion 12) first, and then drive the second gate line portion 12 (or the first gate line portion 11). It is possible to avoid simultaneous turning-on of the display TFTs 10 controlled by the first gate line portion 11 and the display TFTs 10 controlled by the second gate line portion 12 and to avoid simultaneous charging for one row of pixel electrodes 7. Therefore, the pulling to the voltage of the common electrode is reduced, which can then reduce the effect on the actual voltage applied on the pixels and alleviate defects such as afterimage and crosstalk appearing in the display apparatus. However, it can be known by those skilled in the art that the first gate line portion 11 and the second gate line portion 12 are electrically connected when the switch element 4 is turned on, so that the first gate line portion 11 and the second gate line portion 12 can be driven simultaneously.

As an example, the switch element 4 is a TFT. For example, a source of the TFT is connected to one end of the first gate line portion 11, a drain of the TFT is connected to one end of the second gate line portion 12, a gate of the TFT is connected to a signal input terminal 9, and the signal input terminal 9 inputs a turning-on signal or a turning-off signal to control the turning on or turning off of the TFT. When the signal input terminal 9 inputs the turning-off signal, the TFT is turned off, and the first gate line portion 11 is disconnected from the second gate line portion 12, so that it is possible to drive the first gate line portion 11 (or the second gate line portion 12) first and then drive the second gate line portion 12 (or the first gate line portion 11). When the signal input terminal 9 inputs the turning-on signal, the TFT is turned on, and the first gate line portion 11 is electrically connected with the second gate line portion 12, so that it is possible to drive the first gate line portion 11 and the second gate line portion 12 simultaneously.

Further, the amplitudes of the turning-on signal and the turning-off signal of the TFT can be selected according to the V-I characteristic of the TFT. In addition, since the display TFTs 10 are arranged within pixels on the array substrate and the display TFTs 10 also need turning-on signals and turning-off signals to control their turning-on and turning-off, in order to simplify the driving method of the array substrate, for example, in an embodiment of the present disclosure, the turning-on signal and the turning-off signal of the TFT are the same as the turning-on signal and the turning-off signal of the display TFTs 10. In addition, The TFT as the switch elements 4 and the display TFTs in an embodiment of the present disclosure have the same structure and are formed at the same time, which can simplify the fabrication method of the array substrate and reduce fabrication cost.

Further, the signal input terminal 9 is connected to an integrated circuit board 8 through a flexible circuit board (not shown in the figure) such that it can receive the turning-on signal or the turning-off signal outputted by the integrated circuit board 8.

Further, the number of pixels driven by the first gate line portion 11 can be the same as or different from the number of pixels driven by the second gate line portion 12.

Further, in order to simplify the fabrication method of the array substrate, for example, in an embodiment of the present disclosure, the first gate driving circuit 2 and the second driving circuit 3 are located on the array substrate (that is Gate Driver on Array, abbreviated as GOA).

Now, in order to avoid too large loss of the gate driving signal during transmission due to the fact that the bonding line between the first gate driving circuit 2 and the first gate line portion 11 located at the edge is too long and the bonding line between the second gate driving circuit 3 and the second gate line portion 12 located at the edge, for example, in an embodiment of the present disclosure, the first gate driving circuit 2 and the second gate driving circuit 3 each comprises at least two portions, each portion of the first gate driving circuit 2 drives at least one of the first gate line portions 11 respectively, and each portion of the second gate driving circuit 3 drives at least one of the second gate line portions 12 respectively.

An embodiment of the present disclosure provides an array substrate on which multiple gate lines are arranged, wherein each of the gate lines is divided into a first gate line portion connected to a first gate driving circuit and a second gate line portion connected to a second gate driving circuit, and a switch element is arranged between the first gate line portion and the second gate line portion. When the switch element is turned off, it is possible to avoid simultaneous turning-on of the display TFTs controlled by the first gate line portion and the display TFTs controlled by the second gate line portion, so as to avoid simultaneous charging for one row of pixel electrodes. Therefore, the pulling to the voltage of a common electrode is reduced, which can then reduce the effect on the actual voltage applied on the pixels and alleviate defects such as afterimage and crosstalk appearing in the display apparatus.

Further, an embodiment of the present disclosure further provides a display apparatus, which comprises any one of the above described array substrates. For example, the display apparatus can be any product or component with display function, such as a liquid crystal panel, electronic paper, an organic light emitting display panel, a cell phone, a tablet, a television, a display, a notebook computer, a digital photo frame, a navigator or the like.

Second Embodiment

Figure 2:
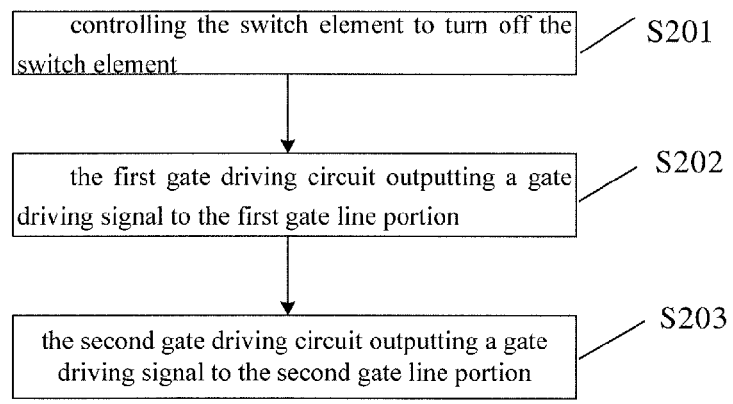
FIG. 2 is a flowchart of a driving method of an array substrate in an embodiment of the present disclosure.

An embodiment of the present disclosure provides a driving method for driving the array substrate in the first embodiment. FIG. 2 is a flowchart of a driving method of an array substrate in an embodiment of the present disclosure. As shown in FIG. 2, the driving method comprises the following steps.

S201: controlling the switch element to turn off the switch element.

S202: the first gate driving circuit outputs a gate driving signal to the first gate line portion.

When the switch element 4 is turned off and the first gate driving circuit 2 drives the first gate line portion 11, the first gate driving circuit 2 outputs a gate driving signal to the first gate line portion 11, so that the display TFTs 10 controlled by the first gate line portion 11 are turned on, data signals outputted by the source driving circuit 5 to the date lines 6 are transferred to the pixel electrodes 7 through the display TFTs 10, so as to charge the pixel electrodes 7 connected to the display TFTs 10 controlled by the first gate line portion 11. Since the switch element 4 connected between the first gate line portion 11 and the second gate line portion 12 is turned off, the gate driving signal outputted by the first gate driving circuit 2 will not affect the display TFTs 10 controlled by the second gate line portion 12.

Figure 3:
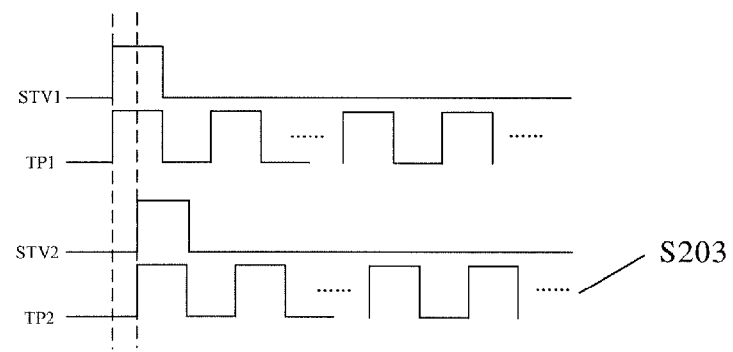
FIG. 3 is a time sequence diagram of a driving method of an array substrate in an embodiment of the present disclosure.

FIG. 3 is a time sequence diagram of a driving method of an array substrate in an embodiment of the present disclosure. As shown in FIG. 3, the first gate driving circuit 2 outputs a gate driving signal STV1 to the first gate line portion 11 so that the display TFTs 10 controlled by the first gate line portion 11 are turned on, and the source driving circuit 5 outputs a data signal TP1, so as to charge the pixel electrodes 7 connected to the display TFTs 10 controlled by the first gate line portion 11.

The driving method further comprises a step S203 in which the second gate driving circuit outputs a gate driving signal to the second gate line portion.

Similarly, the gate driving signal outputted by the second gate driving circuit 3 will not affect the display TFTs 10 controlled by the first gate line portion 11.

As shown in FIG. 3, the second gate driving circuit 3 outputs a gate driving signal STV2 to the second gate line portion 12 so that the display TFTs 10 controlled by the second gate line portion 12 are turned on, and the source driving circuit 5 outputs a data signal TP2, so as to charge the pixel electrodes 7 connected to the display TFTs 10 controlled by the second gate line portion 12.

After the gate driving signal STV1 outputted by the first gate driving circuit 2 lasts for a time period, the second gate driving circuit 3 outputs the gate driving signal STV2, so that the pixel electrodes 7 connected to the display TFTs 10 controlled by the second gate line portion 12 begin to be charged after the pixel electrodes 7 connected to the display TFTs 10 controlled by the first gate line portion 11 have been charged for a time period. It is possible to avoid simultaneous charging of one row of pixel electrodes 7.

As an example, a scan time of one gate line 1 is T, and after the gate driving signal STV1 outputted by the first gate driving circuit 2 lasts for 0.4T~0.5T, the second gate driving circuit 3 outputs the gate driving signal STV2. For example, the scan time of one gate line is $\frac{1}{60}$ s, and after the gate driving signal STV1 outputted by the first gate driving circuit 2 lasts for $\frac{1}{150}$ s or $\frac{1}{120}$ s, the second gate driving circuit 3 outputs the gate driving signal STV2. It is noted that how long the gate driving signal STV1 outputted by the first gate driving circuit 2 lasts before the second gate driving circuit 3 outputs the gate driving signal STV2 can be set by those skilled in the art based on actual needs as long as human eyes cannot observe the non-synchronicity of pictures in the display apparatus.

An embodiment of the present disclosure provides a driving method for driving the array substrate, comprising: controlling the switch element to turn off the switch element; the first gate driving circuit outputting a gate driving signal to the first gate line portion; and the second gate driving circuit outputting a gate driving signal to the second gate line portion, wherein after the gate driving signal outputted by the first gate driving circuit lasts for a time period, the second gate driving circuit outputs the gate driving signal. Since the second gate driving circuit outputs the gate driving signal after the gate driving signal outputted by the first gate driving circuit lasts for a time period, the display TFTs controlled by the first gate line portion are turned on before the turning-on of the display TFTs controlled by the second gate line, avoiding simultaneous turning-on of the display TFTs controlled by the first gate line portion and the display TFTs controlled by the second gate line portion and avoiding simultaneous charging for one row of pixel electrodes. Therefore, the pulling to the voltage of a common electrode is reduced, which can then reduce the effect on the actual voltage applied on the pixels and alleviate defects such as afterimage and crosstalk appearing in the display apparatus.

With the description on the above embodiments, those skilled in the art can clearly understand that the present disclosure can be implemented by software plus necessary general hardware, or by hardware, and the former is a better implementation in many cases. Under such understanding, the technical solutions of the present disclosure essentially or the part of the present disclosure contributing to the known solutions can be embodied by a software product. The computer software product can be stored in a readable storage medium such as a soft disk, a hard disk or a CD of a computer, or the like, and comprises instructions that make a computer (which can be a personal computer, a server, a network device or the like) perform the methods described in embodiments of the present disclosure.

The above descriptions are only specific implementations of the present disclosure, but the protection scope of the present disclosure is not limited to this. Changes or replacements that can be easily devised by those skilled in the art within the technical scope of the present disclosure should all fall within the protection scope of the present disclosure. Therefore, the protection scope of the present disclosure should be defined by the protection scope of the claims.

The present application claims the priority of a Chinese Patent Application No. 201410658924.0 filed on Nov. 18, 2014, entire content of which is incorporated as part of the present invention by reference.

What is claimed is:

1. An array substrate on which a first gate driving circuit, a second gate driving circuit, a source driving circuit and multiple gate lines are arranged, two ends of the gate lines being connected to the first gate driving circuit and the second gate driving circuit respectively, each of the gate lines being divided into a first gate line portion connected to the first gate driving circuit and a second gate line portion connected to the second gate driving circuit, and a switch element being arranged between the first gate line portion and the second gate line portion, wherein, the first gate line portion and the second gate line portion respectively drive different numbers of pixels to display a single image, when the switch element is turned on, the first gate driving circuit and the second gate driving circuit are configured to simultaneously output a first gate driving signal and a second gate driving signal respectively, when the switch element is turned off, the second gate driving circuit is configured to output the second gate driving signal after the first gate driving signal outputted by the first gate driving circuit lasts for a predetermined time period, and the source driving circuit is configured to output a first data signal to the pixels driven by the first gate line portion while the first gate driving circuit output the first gate driving signal, and to output a second data signal to the pixels driven by the second gate line portion while the second gate driving circuit outputting the second gate driving signal.

2. The array substrate according to claim 1, wherein the switch element is a thin film transistor (TFT).

3. The array substrate according to claim 2, wherein a source of the TFT is connected to the first gate line portion, a drain of the TFT is connected to the second gate line portion, a gate of the TFT is connected to a signal input terminal, and the signal input terminal inputs a turning-on signal or a turning-off signal to control the turning on or turning off of the TFT.

4. The array substrate according to claim 3, wherein the array substrate further comprises a display TFT located within a pixel, the turning-on signal and the turning-off signal of the TFT are the same as a turning-on signal and a turning-off signal of the display TFT.

5. The array substrate according to claim 4, wherein the signal input terminal is connected to an integrated circuit board through a flexible circuit board.

6. The array substrate according to claim 3, wherein the signal input terminal is connected to an integrated circuit board through a flexible circuit board.

7. The array substrate according to claim 1, wherein the first gate driving circuit and the second driving circuit are located on the array substrate.

8. The array substrate according to claim 7, wherein the first gate driving circuit and the second gate driving circuit each comprises at least two portions, each portion of the first gate driving circuit drives at least one of the first gate line portions respectively, and each portion of the second gate driving circuit drives at least one of the second gate line portions respectively.

9. A display apparatus comprising the array substrate according to claim 1.

10. The display apparatus according to claim 9, wherein the switch element is a thin film transistor (TFT).

11. The display apparatus according to claim 10, wherein a source of the TFT is connected to the first gate line portion, a drain of the TFT is connected to the second gate line portion, a gate of the TFT is connected to a signal input terminal, and the signal input terminal inputs a turning-on signal or a turning-off signal to control the turning on or turning off of the TFT.

12. The display apparatus according to claim 11, wherein the array substrate further comprises a display TFT located within a pixel, the turning-on signal and the turning-off signal of the TFT are the same as a turning-on signal and a turning-off signal of the display TFT.

13. The display apparatus according to claim 11, wherein the signal input terminal is connected to an integrated circuit board through a flexible circuit board.

14. A driving method for driving the array substrate according to claim 1, comprising:

controlling the switch element to turn off the switch element;

the first gate driving circuit outputting a gate driving signal to the first gate line portion; and the second gate driving circuit outputting a gate driving signal to the second gate line portion, wherein after the gate driving signal outputted by the first gate driving circuit lasts for a time period, the second gate driving circuit outputs the gate driving signal.

15. The driving method for driving the array substrate according to claim 14, wherein a scan time of one of the gate lines is T, and after the gate driving signal outputted by the first gate driving circuit lasts for 0.4T~0.5T, the second gate driving circuit outputs the gate driving signal.

16. The driving method for driving the array substrate according to claim 14, wherein the switch element is a thin film transistor (TFT).

17. The driving method for driving the array substrate according to claim 16, wherein a source of the TFT is connected to the first gate line portion, a drain of the TFT is connected to the second gate line portion, a gate of the TFT is connected to a signal input terminal, and the signal input terminal inputs a turning-on signal or a turning-off signal to control the turning on or turning off of the TFT.

18. The driving method for driving the array substrate according to claim 17, wherein the array substrate further comprises a display TFT located within a pixel, the turning-on signal and the turning-off signal of the TFT are the same as a turning-on signal and a turning-off signal of the display TFT.

19. The driving method for driving the array substrate according to claim 17, wherein the signal input terminal is connected to an integrated circuit board through a flexible circuit board.

* * * * *